(12) United States Patent
Priewasser et al.

(10) Patent No.: US 11,894,271 B2
(45) Date of Patent: Feb. 6, 2024

(54) METHOD OF PROCESSING WAFER

(71) Applicant: DISCO CORPORATION, Tokyo (JP)

(72) Inventors: Karl Heinz Priewasser, Munich (DE); Hideyuki Sandoh, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 444 days.

(21) Appl. No.: 17/380,606

(22) Filed: Jul. 20, 2021

(65) Prior Publication Data

US 2022/0028742 A1 Jan. 27, 2022

(30) Foreign Application Priority Data

Jul. 22, 2020 (JP) ................................ 2020-125480

(51) Int. Cl.
*H01L 21/78* (2006.01)
*H01L 21/66* (2006.01)
*H01L 21/3065* (2006.01)

(52) U.S. Cl.
CPC .......... *H01L 21/78* (2013.01); *H01L 21/3065* (2013.01); *H01L 22/12* (2013.01); *H01L 22/20* (2013.01)

(58) Field of Classification Search
None
See application file for complete search history.

(56) References Cited

U.S. PATENT DOCUMENTS

| | | | | |
|---|---|---|---|---|
| 5,711,849 A | * | 1/1998 | Flamm | H01J 37/32935 700/121 |
| 2006/0016559 A1 | * | 1/2006 | Kobayashi | H01J 37/32082 156/345.34 |
| 2009/0242513 A1 | * | 10/2009 | Funk | H01L 22/20 700/110 |
| 2014/0193977 A1 | * | 7/2014 | Kawamata | H01J 37/32449 156/345.26 |
| 2015/0132925 A1 | * | 5/2015 | Matsuzaki | H01L 21/78 438/465 |
| 2018/0096892 A1 | * | 4/2018 | Sandoh | H01L 21/3065 |
| 2018/0144983 A1 | * | 5/2018 | Shigematsu | H01L 21/02076 |

FOREIGN PATENT DOCUMENTS

JP 2006294686 A 10/2006

* cited by examiner

*Primary Examiner* — Erik T. K. Peterson
(74) *Attorney, Agent, or Firm* — Greer Burns & Crain Ltd.

(57) ABSTRACT

A method of processing a wafer includes a wafer preparing step of preparing a measurement wafer and a product wafer, a measurement etching step of supplying a gas in a plasma state to first areas of the measurement wafer that correspond to streets thereon to form grooves in the measurement wafer, a measuring step of demarcating a plurality of concentric areas in an array from a center to an outer circumference of the measurement wafer, and measuring depths of the grooves in the respective concentric areas, a thickness adjusting step of adjusting a thickness of the product wafer such that the product wafer is progressively thinner in areas thereof that correspond to the areas of the measurement wafer where the grooves are shallower, and an etching step of supplying a gas in a plasma state to second areas of the product wafer that correspond to streets thereon.

3 Claims, 11 Drawing Sheets

METHOD OF PROCESSING WAFER

BACKGROUND OF THE INVENTION

Field of the Invention

The present invention relates to a method of processing a wafer by way of plasma etching.

Description of the Related Art

Processes of manufacturing device chips use wafers from which to fabricate device chips. A wafer has a plurality of devices formed in respective areas demarcated on a face side thereof by a grid of streets or projected dicing lines established on the face side. The wafer is divided along the street into a plurality of device chips including the respective devices. The device chips will be incorporated in various electronic appliances such as mobile phones and personal computers.

For dividing a wafer, there is used a cutting apparatus for cutting the wafer with an annular cutting blade. When the cutting apparatus is in operation, the annular cutting blade on the cutting apparatus is rotated and cuts into the wafer along the streets, severing the wafer along the streets. In recent years, attention has been given to the technology for dividing wafers according to a laser process. For example, a laser beam is applied to a wafer to form division initiating points such as grooves or modified layers in the wafer along streets established on the wafer. Then, external forces are applied to the wafer to cause the wafer to fracture from the division initiating points, thereby dividing the wafer into a plurality of device chips.

However, when a wafer is divided by a cutting process or a laser process, the wafer is liable to suffer processing defects. For example, when a wafer is divided by a cutting blade, the wafer may produce chippings from its face or reverse side. When a wafer is divided by a laser process, the wafer may develop local regions where its crystallinity is changed, i.e., crystal strain layers, surface irregularities, or the like due to the heat generated by a laser beam applied to the wafer. If such processing defects remain on device chips produced from the wafer by dividing same, a problem arises in that the device chips have their flexural strength lowered.

In view of the above difficulties, there has been proposed a process of dividing a wafer by way of plasma etching. For example, JP 2006-294686A discloses a method of dividing a wafer along streets by forming a resist film or mask on the reverse side of the wafer and supplying an etching gas in a plasma state through the mask to the wafer. Plasma etching is less likely to afflict wafers with processing defects than the cutting process and the laser process. Therefore, when a wafer is divided by plasma etching, the flexural strength of device chips produced from the wafer is restrained from being lowered.

SUMMARY OF THE INVENTION

For dividing a wafer by way of plasma etching, a gas in a plasma state is supplied to an upper surface of the wafer, for example, forming grooves in the wafer along streets established on the wafer. When the grooves reach a lower surface of the wafer due to the etching in progress, the wafer is divided along the streets. Therefore, etching conditions including an etching time, a gas flow rate, etc. are established to cause the grooves to reach the lower surface of the wafer all over the wafer. However, etching rate variations may occur in the wafer as a result of various factors including gas flow deviations, plasma density deviations, etc. in the plasma etching. In the event of such etching rate variations, notwithstanding that the grooves in a central area of the wafer have reached the lower surface of the wafer, the grooves in an outer circumferential portion of the wafer may terminate short of the lower surface of the wafer, leading to imperfect division of the wafer. In view of the shortcoming, etching conditions are adjusted for reliable division of the wafer to cause the grooves to reach the lower surface of the wafer in areas where the wafer is hardest to etch.

However, under the etching conditions thus adjusted, in the areas of the wafer where the etching rate is higher, i.e., where the etching progresses faster, the etching still continues after the grooves have reached the lower surface of the wafer, tending to excessively process the lower surface of the wafer with the laser beam. As a consequence, some of the device chips produced by dividing the wafer tend to be brought out of shape, resulting in a reduction in the quality of the device chips.

The present invention has been made in view of the above problems. It is therefore an object of the present invention to provide a method of processing a wafer to appropriately divide the wafer by way of plasma etching.

In accordance with an aspect of the present invention, there is provided a method of processing a wafer, including: a wafer preparing step of preparing a measurement wafer and a product wafer each including a first surface that has a plurality of areas demarcated by a plurality of streets thereon and a second surface that is opposite the first surface; a measurement etching step of forming a first mask on the first surface or the second surface of the measurement wafer and supplying a gas in a plasma state to first areas of the measurement wafer that are exposed through the first mask and that correspond to the streets to etch the first areas under predetermined conditions to form grooves in the measurement wafer; after the measurement etching step, a measuring step of demarcating a plurality of concentric areas in an array from a center to an outer circumference of the measurement wafer and measuring depths of the grooves in the respective concentric areas; after the measuring step, a thickness adjusting step of adjusting a thickness of the product wafer such that the product wafer is progressively thinner in areas thereof that correspond to the areas of the measurement wafer where the grooves are shallower; and, after the thickness adjusting step, an etching step of forming a second mask on the first surface or the second surface of the product wafer and supplying a gas in a plasma state to second areas of the product wafer that are exposed through the second mask and that correspond to the streets to etch the second areas under predetermined conditions.

Preferably, the thickness adjusting step includes performing grinding, polishing, or plasma etching on the product wafer to adjust the thickness of the product wafer. Preferably, the measurement etching step includes supplying the gas in the plasma state to the measurement wafer while a first protective member for protecting the measurement wafer is disposed on a surface of the measurement wafer that is opposite to the surface thereof to which the gas in the plasma state is supplied, and the etching step includes supplying the gas in the plasma state to the product wafer while a second protective member for protecting the product wafer is disposed on a surface of the product wafer that is opposite to the surface thereof to which the gas in the plasma state is supplied.

In the method of processing a wafer according to the aspect of the present invention, the thickness of the product wafer is adjusted depending on the depths of the grooves formed in the measurement wafer by plasma etching, and thereafter plasma etching is performed on the product wafer. The etching rate variations in the product wafer are thus reflected in the thickness distribution of the product wafer, thereby synchronizing the times when the division of the product wafer in the areas thereon is completed. In this manner, the product wafer is less liable to have areas where it is etched imperfectly and areas where it is etched excessively, and hence can be divided properly.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will be described below with reference to the accompanying drawings. First, configuration examples of wafers that can be used in a method of processing a wafer according to the present embodiment will be described below. According to the present embodiment, the wafers that can be used in the method of processing a wafer include a product wafer to be used in manufacturing actual products and a measurement wafer to be used in selecting processing conditions for the product wafer.

Figure 1A:
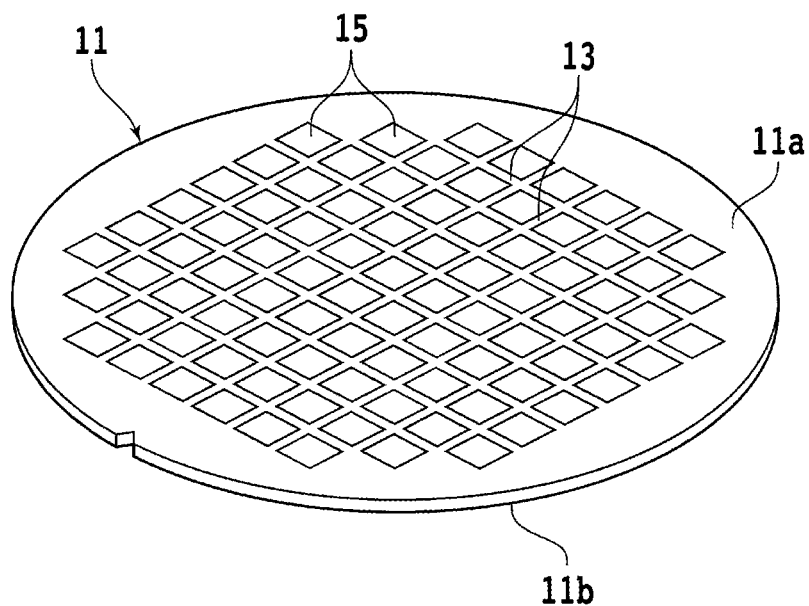
FIG. 1A is a perspective view of a measurement wafer.
Figure 1B:
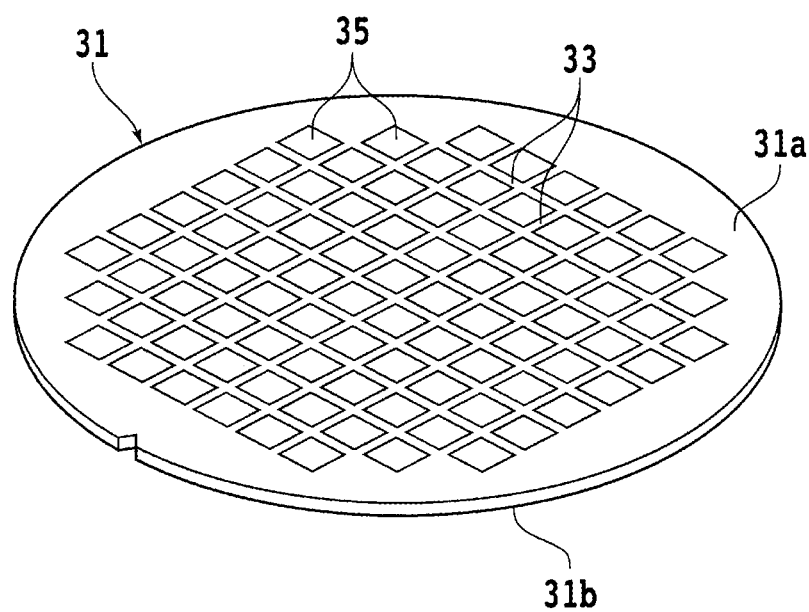
FIG. 1B is a perspective view of a product wafer.

FIG. 1A illustrates in perspective a wafer 11 that servers as a measurement wafer, also referred to as a test wafer, to be used in selecting processing conditions for a product wafer (see FIG. 1B). The wafer 11 includes a disk-shaped substrate made of a semiconductor such as silicon, for example, and includes a face side, i.e., a first surface, 11a and a reverse side, i.e., a second surface, 11b opposite the face side 11a. The face side 11a of the wafer 11 has a plurality of rectangular areas demarcated by a grid of streets or projected dicing lines 13 established on the face side 11a. The streets 13 are separated into two groups that extend across each other. A plurality of devices 15 such as integrated circuits (ICs), large-scale-integration (LSI) circuits, light-emitting diodes (LEDs), or microelectromechanical systems (MEMS) are formed respectively in the demarcated areas.

The wafer 11 is not limited to any particular material, shape, structure, size, etc. For example, the wafer 11 may be a substrate made of semiconductors other than silicon, e.g., GaAs, InP, GaN, SiC, or the like, sapphire, glass, ceramic, resin, metal, or the like. The devices 15 are not limited to any kind, quantity, shape, structure, size, layout, etc.

FIG. 1B illustrates in perspective a wafer 31 that serves as a product wafer to be used in manufacturing actual products (device chips or the like). The wafer 31 has a configuration similar to that of the wafer 11 (see FIG. 1A). Specifically, the wafer 31 includes a face side, i.e., a first surface, 31a and a reverse side, i.e., a second surface, 31b opposite the face side 31a. The face side 31a of the wafer 31 has a plurality of rectangular areas demarcated by a grid of streets or projected dicing lines 33 established on the face side 31a. The streets 33 are separated into two groups that extend across each other. A plurality of devices 35 are formed respectively in the demarcated areas. The wafer 31 is of the similar material, shape, structure, size, etc. to the wafer 11. The devices 35 are of the similar kind, quantity, shape, structure, size, layout, etc. to the devices 15.

The wafer 31 will be processed and cut along the streets 33 into a plurality of device chips including the respective devices 35. Processing conditions for processing the wafer 31 are selected on the basis of the results of a test conducted using the wafer 11. A specific example of the method of processing a wafer according to the present embodiment will be described below.

First, a measurement wafer and a product wafer are prepared (wafer preparing step). In the wafer preparing step, specifically, the wafer 11 illustrated in FIG. 1A and the wafer 31 illustrated in FIG. 1B are formed.

Since the wafer 11 is used in selecting processing conditions for processing the wafer 31, as described later, the wafer 11 should preferably have similar details to the wafer 31. Specifically, the wafer 11 should preferably be made of the same material as the wafer 31. Further, the number of the streets 13 should preferably be the same as the number of the streets 33, and the width of the streets 13 should preferably be generally the same as the width of the streets 33. Further, the dimensions of and distances between the devices 15 on the wafer 11 should preferably be generally the same as the dimensions of and distances between the devices 35 on the wafer 31. However, the details of the wafer 11 may be different from the details of the wafer 31 within a range where processing conditions for processing the wafer 31 can appropriately be selected. For example, since the wafer 11 is not used in manufacturing actual device chips, the wafer 11 may not necessarily have the devices 15.

The wafer 11 and the wafer 31 will be processed by plasma etching in a subsequent step. Therefore, a protective member for protecting the wafer 11 is applied to the face side 11a or the reverse side 11b of the wafer 11. Similarly, a protective member for protecting the wafer 31 is applied to the face side 31a or the reverse side 31b of the wafer 31.

Figure 2A:
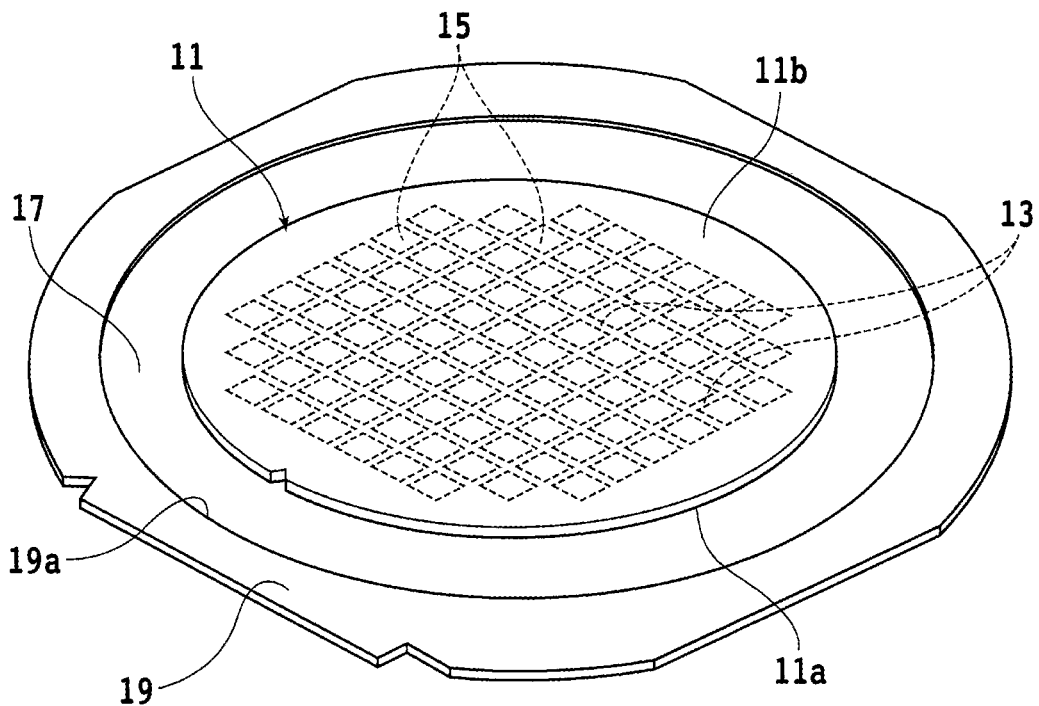
FIG. 2A is a perspective view of the measurement wafer with a protective member attached thereto.

FIG. 2A illustrates in perspective the wafer 11 with a protective member, i.e., a first protective member, 17 disposed thereon. For example, a circular protective member 17 that is larger in diameter than the wafer 11 is fixed to the face side 11a of the wafer 11. The face side 11a of the wafer 11 and the devices 15 thereon are thus covered with and protected by the protective member 17. The protective member 17 may include a film-like tape, for example. The tape includes a circular base and an adhesive layer, i.e., a glue layer, disposed on the base. The base is made of a resin such as polyolefin, polyvinyl chloride, or polyethylene terephthalate, for example, whereas the adhesive layer is made of an adhesive of an epoxy material, an acrylic material, a rubber material, or the like, for example. Alternatively, the adhesive layer may be made of an ultraviolet-curable resin that can be cured by ultraviolet rays applied thereto.

The protective member 17 has an outer circumferential portion affixed to an annular frame 19 made of metal or the like. The frame 19 has a circular opening 19a defined therein that is larger in diameter than the wafer 11. The wafer 11 is affixed centrally to the protective member 17 such that the wafer 11 is disposed within the opening 19a. The wafer 11 is thus supported on the frame 19 by the protective member 17 for being easily handled, e.g., transported, held, or otherwise treated.

Figure 2B:
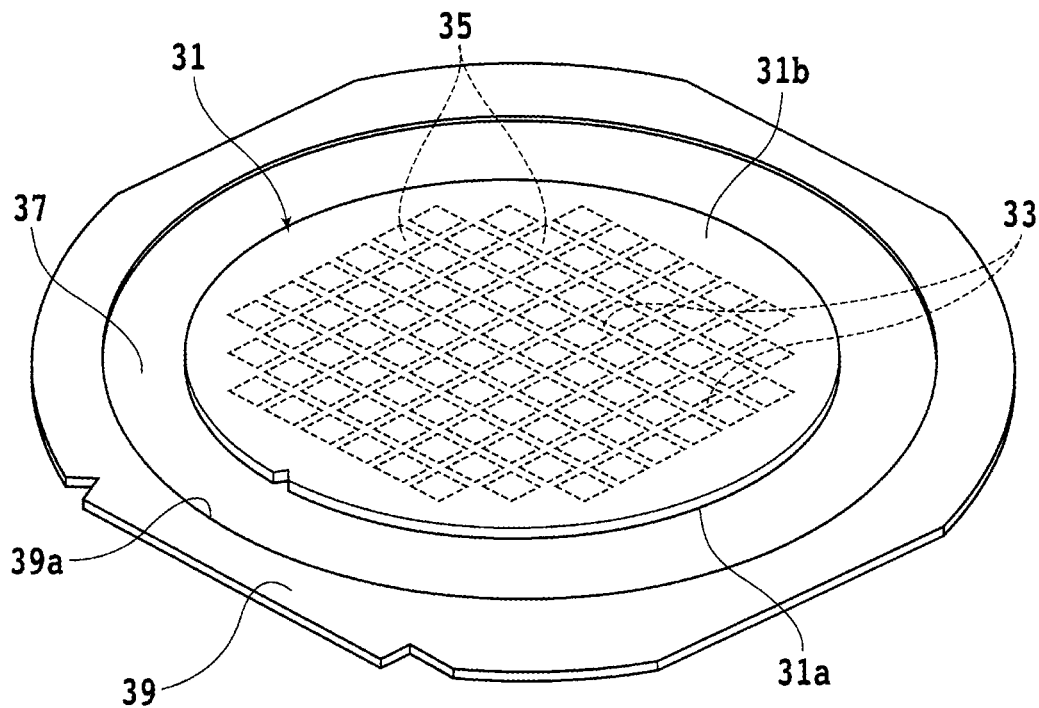
FIG. 2B is a perspective view of the product wafer with a protective member attached thereto.

FIG. 2B illustrates in perspective the wafer 31 with a protective member, i.e., a second protective member, 37 disposed thereon. For example, a circular protective member 37 that is larger in diameter than the wafer 31 is fixed to the face side 31a of the wafer 31. The face side 31a of the wafer 31 and the devices 35 thereon are thus covered with and protected by the protective member 37. The protective member 37 has an outer circumferential portion affixed to an annular frame 39 made of metal or the like. The frame 39 has a circular opening 39a defined therein that is larger in diameter than the wafer 31. The wafer 31 is affixed centrally to the protective member 37 such that the wafer 31 is disposed within the opening 39a. The wafer 31 is thus supported on the frame 39 by the protective member 37. The protective member 37 is of the similar shape, structure, material, etc. to the protective member 17. The frame 39 is of the similar shape, structure, material, etc. to the frame 19.

The wafer 11 and the wafer 31 may be formed at appropriately selected times. Specifically, the wafer 11 may be prepared until a measurement etching step to be described later, and the wafer 31 may be prepared until a thickness adjusting step to be described later.

Next, a gas in a plasma state is supplied to the areas of the wafer 11 that correspond to the streets 13 to form grooves in the wafer 11 (measurement etching step). In the measurement etching step, the wafer 11 is processed by plasma etching to etch the wafer 11 along the streets 13. By way of example, a process of supplying a gas in a plasma state to the reverse side 11b of the wafer 11 to etch the wafer 11 will be described below as the measurement etching step.

In the measurement etching step, first, a mask 23 (see FIG. 3B) for plasma etching is formed on the reverse side 11b of the wafer 11. For example, the mask 23 may be formed on the reverse side 11b by depositing a mask layer 21 (see FIG. 3A) on the reverse side 11b and then removing the areas of the mask layer 21 that correspond to the streets 13.

Figure 3A:
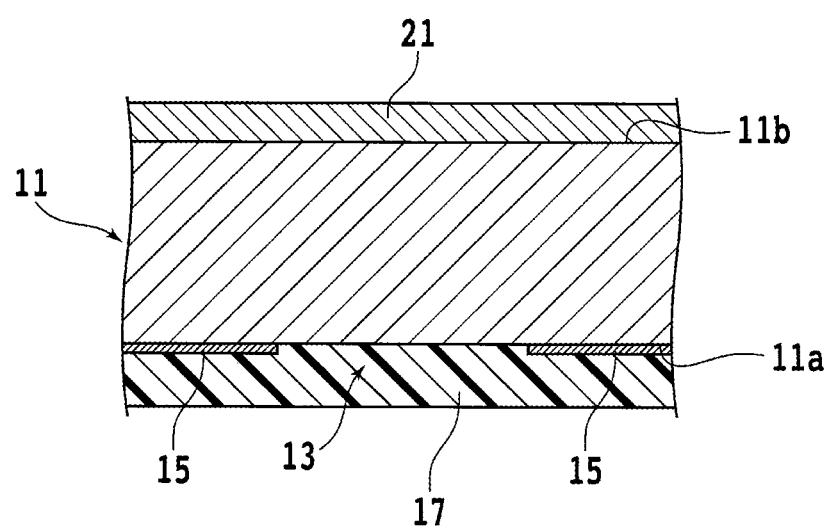
FIG. 3A is an enlarged fragmentary cross-sectional view of the measurement wafer with a mask layer formed thereon.

FIG. 3A illustrates in enlarged fragmentary cross section the wafer 11 with the mask layer 21 formed thereon. The mask layer 21 is made of a material functioning as a mask during plasma etching and is deposited in covering relation to the reverse side 11b in its entirety. For example, the mask layer 21 may be made of a water-soluble resin such as polyvinyl alcohol (PVA) or polyethylene glycol (PEG). Then, the areas of the mask layer 21 that correspond to the streets 13 are removed. For example, a laser beam is applied to the mask layer 21 along the streets 13 to remove the areas of the mask layer 21 that correspond to the streets 13. The laser beam is applied under conditions including a wavelength, a power level, a spot diameter, a repetitive frequency, etc. that are selected to process the mask layer 21 by way of ablation when the laser beam is applied to the mask layer 21. When the mask layer 21 is removed along all the streets 13, a grid-shaped opening through which part of the reverse side 11b of the wafer 11 is exposed is formed in the mask layer 21.

Figure 3B:
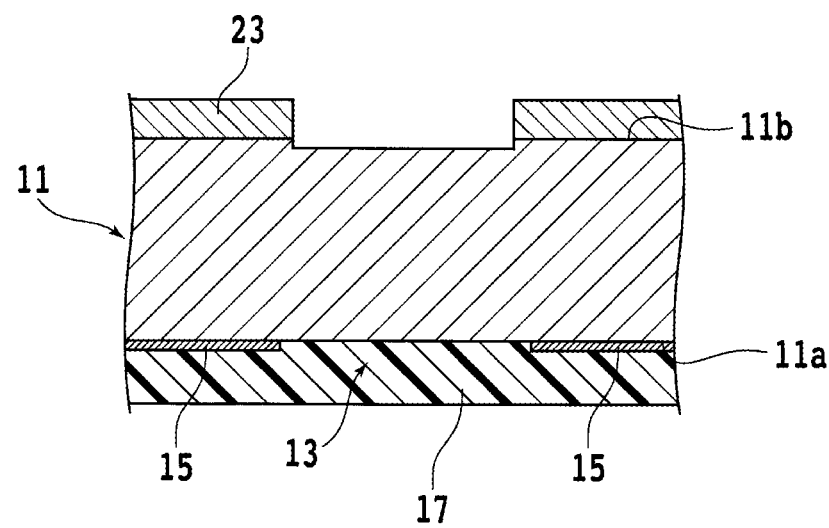
FIG. 3B is an enlarged fragmentary cross-sectional view of the measurement wafer with a mask formed thereon.

FIG. 3B illustrates in enlarged fragmentary cross section the wafer 11 with the mask, i.e., a first mask, 23 formed thereon. The mask layer 21 is patterned as described above to form the mask 23 through which the areas of the reverse side 11b of the wafer 11 that correspond to the streets 13, i.e., the areas overlapping the streets 13, are exposed and which covers the areas of the reverse side 11b of the wafer 11 that correspond to the devices 15, i.e., the areas overlapping the devices 15. The mask 23 may be formed of other materials than the materials described above and may be formed by other processes than the process described above. For example, the mask layer 21 may be made of a resist of photosensitive resin and may be patterned into the mask 23 by being exposed to light.

Figure 4:
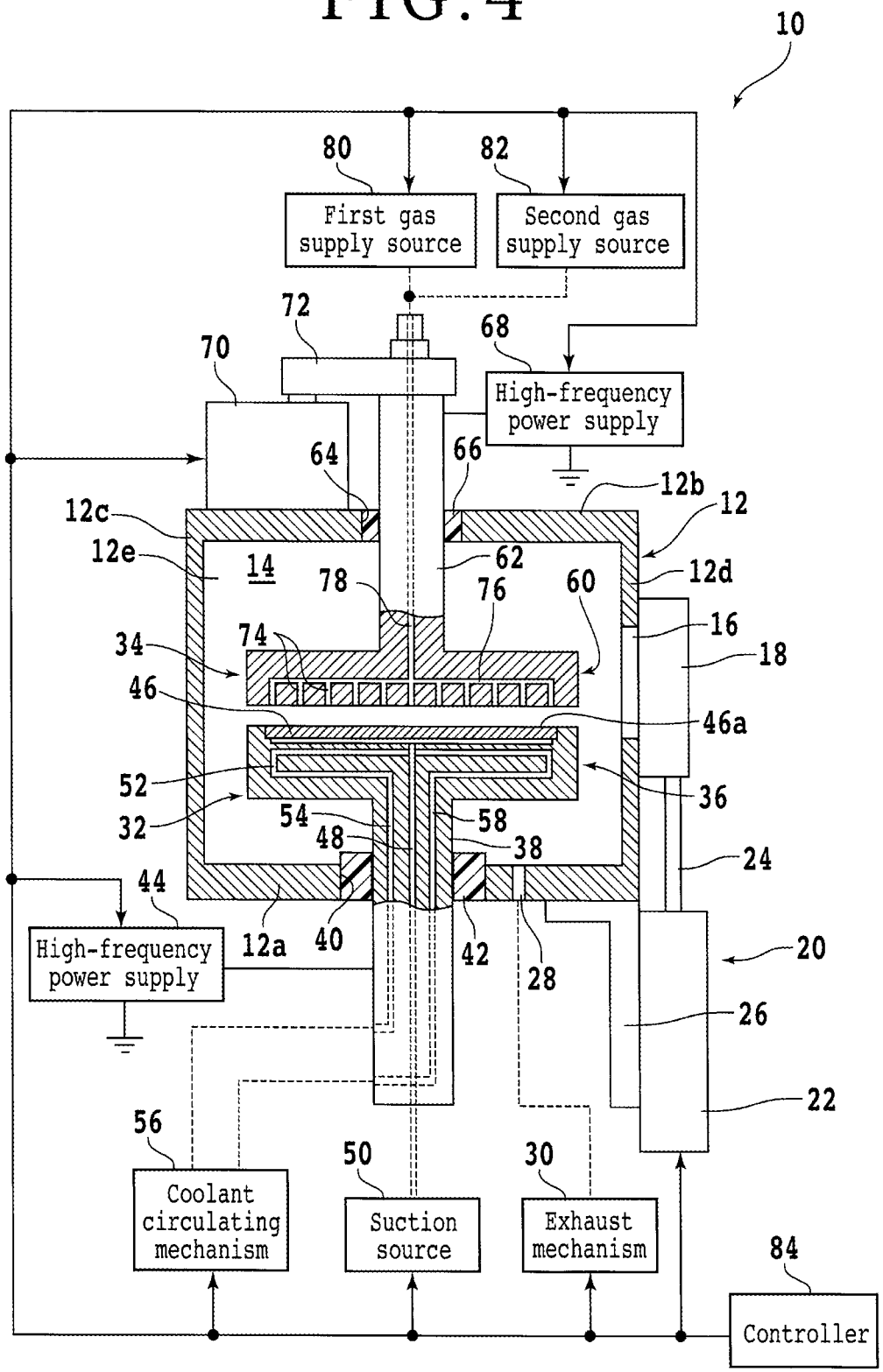
FIG. 4 is a schematic view, partly in cross section, of a plasma processing apparatus.

Next, a gas in a plasma state is supplied to the areas of the wafer 11 that are exposed through the mask 23 and correspond to the streets 13, etching those areas under predetermined conditions. The wafer 11 is etched using a plasma processing apparatus, for example. FIG. 4 schematically illustrates in cross section a plasma processing apparatus 10 that is used to etch the wafer 11.

As illustrated in FIG. 4, the plasma processing apparatus 10 includes a chamber 12 in the shape of a rectangular parallelepiped. The chamber 12 includes a bottom wall 12a, an upper wall 12b, a first side wall 12c, a second side wall 12d, a third side wall 12e, and a fourth side wall, not illustrated. The chamber 12 has an internal space acting as a processing space 14 in which a plasma process is carried out.

The second side wall 12d has an opening 16 defined therein through which a wafer 11 can be loaded into and unloaded out of the processing space 14. A gate, i.e., an openable and closable door, 18 for opening and closing the opening 16 is disposed outside of the opening 16. The gate 18 is connected to an opening and closing mechanism 20 that can move the gate 18 vertically, i.e., upwardly and downwardly. The opening and closing mechanism 20 includes an air cylinder 22 having a piston rod 24, for example. The piston rod 24 has an upper end coupled to a lower portion of the gate 18. The air cylinder 22 is fixed to the bottom wall 12a of the chamber 12 by a bracket 26. When the opening and closing mechanism 20 lowers the gate 18, the opening 16 is exposed. Now, a wafer 11 can be loaded through the opening 16 into the processing space 14 or unloaded out of the processing space 14 through the opening 16.

The bottom wall 12*a* of the chamber 12 has an exhaust port 28 defined therein that provides fluid communication between the inside and outside of the chamber 12. An exhaust mechanism 30 for evacuating the processing space 14 is connected to the exhaust port 28. The exhaust mechanism 30 includes a vacuum pump, for example.

The processing space 14 houses therein a lower electrode 32 and an upper electrode 34 that vertically confront each other. The lower electrode 32 is made of an electrically conductive material and includes a disk-shaped holder 36 and a cylindrical support post 38 projecting downwardly from a central portion of a lower surface of the holder 36.

The support post 38 is inserted through an opening 40 defined in the bottom wall 12*a* of the chamber 12. An annular insulating member 42 is disposed in the opening 40 between the bottom wall 12*a* and the support post 38, insulating the chamber 12 and the lower electrode 32 from each other. The lower electrode 32 is electrically connected to a high-frequency power supply 44 disposed outside of the chamber 12. The holder 36 has an upwardly open recess defined in an upper surface thereof and housing therein a disk-shaped table 46 for holding the wafer 11 thereon. The table 46 has an upper surface acting as a holding surface 46*a* for holding the wafer 11 thereon. The holding surface 46*a* is connected to a suction source 50 such as an ejector through a fluid channel, not illustrated, defined in the table 46 and a fluid channel 48 defined in the lower electrode 32. The holder 36 has a coolant channel 52 defined therein. The coolant channel 52 has an end connected to a coolant circulating mechanism 56 through a coolant inlet passage 54 defined in the support post 38. The other end of the coolant channel 52 is connected to the coolant circulating mechanism 56 through a coolant outlet passage 58 defined in the support post 38. When the coolant circulating mechanism 56 is actuated, a coolant flows therefrom successively through the coolant inlet passage 54, the coolant channel 52, and the coolant outlet passage 58, cooling the lower electrode 32.

The upper electrode 34 is made of an electrically conductive material and includes a disk-shaped gas ejecting member 60 and a cylindrical support post 62 projecting upwardly from a central portion of an upper surface of the gas ejecting member 60. The support post 62 is inserted through an opening 64 defined in the upper wall 12*b* of the chamber 12. An annular insulating member 66 is disposed in the opening 64 between the upper wall 12*b* and the support post 62, insulating the chamber 12 and the upper electrode 34 from each other. The upper electrode 34 is electrically connected to a high-frequency power supply 68 disposed outside of the chamber 12. The support post 62 has an upper end on which there is mounted a support arm 72 coupled to a lifting and lowering mechanism 70. The lifting and lowering mechanism 70 and the support arm 72 move the upper electrode 34 vertically, i.e., lift the upper electrode 34 upwardly and lower the upper electrode 34 downwardly. The gas ejecting member 60 has a plurality of ejection ports 74 defined therein and opening downwardly from a lower surface thereof. The ejection ports 74 are connected to a first gas supply source 80 and a second gas supply source 82 through a fluid channel 76 defined in the gas ejecting member 60 and a fluid channel 78 defined in the support post 62. The first gas supply source 80 and the second gas supply source 82 are capable of supplying respective gases that contain different components to the fluid channel 78.

The constituents of the plasma processing apparatus 10 that include the opening and closing mechanism 20, the exhaust mechanism 30, the high-frequency power supply 44, the suction source 50, the coolant circulating mechanism 56, the high-frequency power supply 68, the lifting and lowering mechanism 70, the first gas supply source 80, and the second gas supply source 82, etc. are electrically connected to a controller, i.e., a control unit or a control device, 84 that controls the plasma processing apparatus 10. The controller 84 controls operation of the constituents of the plasma processing apparatus 10. For example, the controller 84 includes a computer and includes a processing section for carrying out processing operations required to operate the plasma processing apparatus 10 and a storage section for storing various pieces of information including data, programs, etc. used by the processing section in carrying out processing operations. The processing section includes a processor such as a central processing unit (CPU). The storage section includes various memories acting as a main storage device, an auxiliary storage device, etc. The processing section generates control signals for controlling the constituents of the plasma processing apparatus 10 by executing the programs stored in the storage section.

For performing plasma etching on a wafer 11 with the plasma processing apparatus 10, the opening and closing mechanism 20 lowers the gate 18 of the plasma processing apparatus 10 to expose the opening 16. Then, a delivery mechanism, not illustrated, loads the wafer 11 through the opening 16 into the processing space 14 in the chamber 12 and places the wafer 11 on the table 46. At this time, the wafer 11 is placed on the table 46 with the reverse side 11*b*, i.e., the mask 23 side, exposed upwardly toward the upper electrode 34. When the wafer 11 is to be loaded into the processing space 14, it is preferable for the lifting and lowering mechanism 70 to lift the upper electrode 34, increasing the spacing between the lower electrode 32 and the upper electrode 34.

Next, the suction source 50 applies a negative pressure to the holding surface 46*a* of the table 46, holding the wafer 11 under suction on the holding surface 46*a*. The opening and closing mechanism 20 lifts the gate 18 to close the opening 16, hermetically sealing the processing space 14. The lifting and lowering mechanism 70 adjusts the vertical position of the upper electrode 34 to bring the upper electrode 34 and the lower electrode 32 into a predetermined positional relation suitable for a plasma process. Then, the exhaust mechanism 30 is actuated to evacuate the processing space 14 to a reduced pressure ranging from 50 to 300 Pa, for example. If the negative pressure applied from the suction source 50 fails to keep the wafer 11 under suction on the table 46 when the processing space 14 is evacuated, then the wafer 11 is held on the table 46 under electric forces, typically electrostatic forces. For example, a plurality of electrodes are embedded in the table 46. A predetermined voltage is applied to these electrodes to apply a Coulomb force between the table 46 and the wafer 11, thereby attracting the wafer 11 to the table 46. At this time, the table 46 functions as an electrostatic chuck table.

Then, the first gas supply source 80 or the second gas supply source 82 supplies a gas for etching, i.e., an etching gas, between the lower electrode 32 and the upper electrode 34 through the fluid channel 78, the fluid channel 76, and the ejection ports 74. At the same time, a predetermined level of high-frequency electric power ranging from 1000 to 3000 W, for example, is applied between the lower electrode 32 and the upper electrode 34. As a result, the gas existing between the lower electrode 32 and the upper electrode 34 turns into a plasma state containing ions and radicals. The gas in the plasma state is supplied to the reverse side 11b of the wafer 11.

Figure 5:
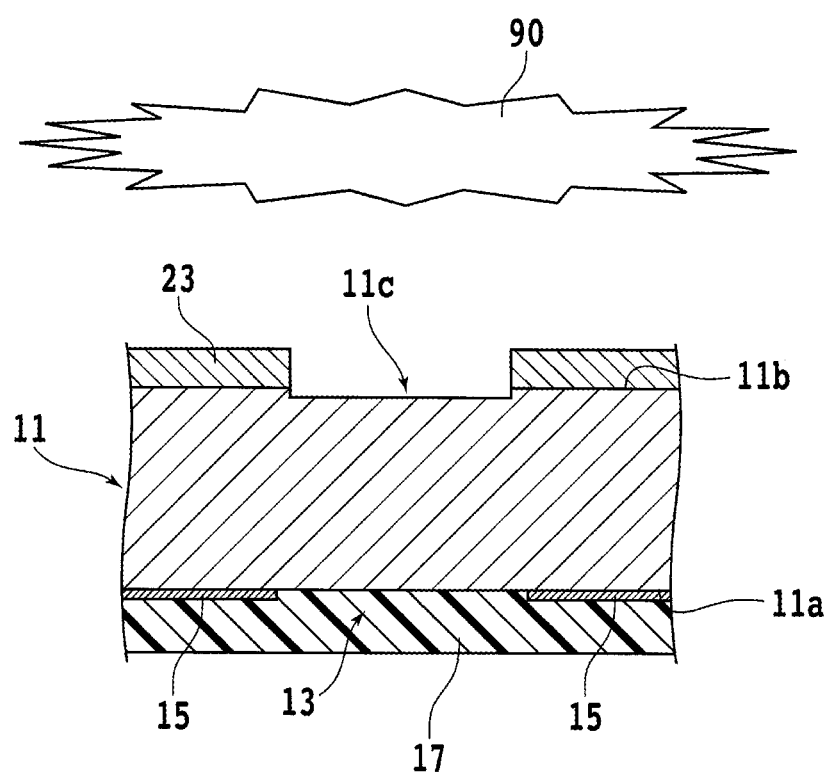
FIG. 5 is an enlarged fragmentary cross-sectional view of the measurement wafer to which a gas in a plasma state is supplied.

FIG. 5 illustrates in enlarged fragmentary cross section the wafer 11 to which the gas, denoted by 90, in the plasma state is supplied. The gas 90 in the plasma state is specifically supplied to those areas, i.e., first areas, 11c of the reverse side 11b of the wafer 11 that are not covered with the mask 23. The areas 11c are exposed through the mask 23 and correspond to the areas corresponding to the streets 13, i.e., the areas overlapping the streets 13. As a result, plasma etching is performed on the areas 11c. In the measurement etching step, the gas 90 is supplied to the wafer 11 while the protective member 17 is disposed on the surface, i.e., the face side 11a, of the wafer 11 that is opposite the surface thereof, i.e., the reverse side 11b, to which the gas 90 is supplied. The components of the gas 90 are appropriately selected depending on the material of the wafer 11. For example, if the wafer 11 is a silicon wafer, then the gas 90 contains a fluorine gas such as $CF_4$ or $SF_6$.

Figure 6A:
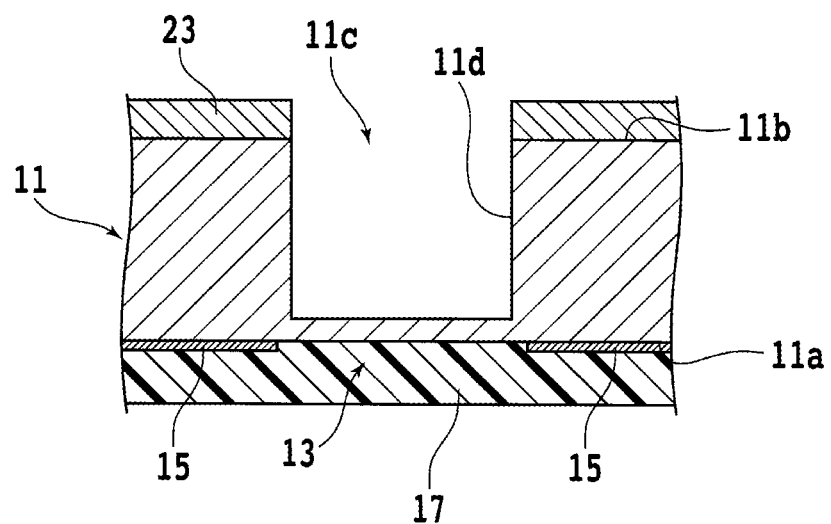
FIG. 6A is an enlarged fragmentary cross-sectional view illustrating a central portion of the measurement wafer after plasma etching.
Figure 6B:
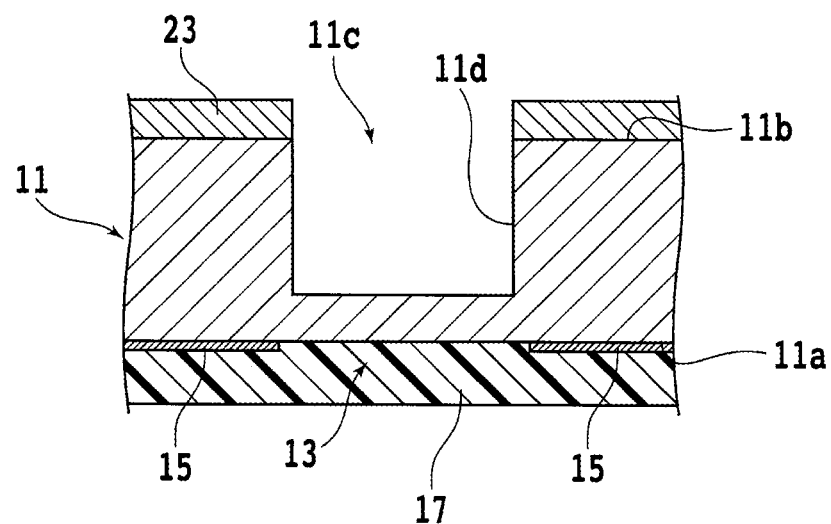
FIG. 6B is an enlarged fragmentary cross-sectional view illustrating an outer circumferential portion of the measurement wafer after plasma etching.

FIG. 6A illustrates in enlarged fragmentary cross section a central portion of the wafer 11 after the plasma etching, and FIG. 6B illustrates in enlarged fragmentary cross section an outer circumferential portion of the wafer 11 after the plasma etching. When the gas 90 in the plasma state is supplied through the mask 23 to the reverse side 11b of the wafer 11, the areas 11c are etched, forming grooves 11d in the wafer 11 from the reverse side 11b toward the face side 11a.

Plasma etching conditions including an etching time, a gas flow rate, a high-frequency electric power level, a pressure in the processing space 14, etc. are identical to plasma etching conditions for dividing the wafer 31 at a subsequent step (see FIGS. 11A and 11B), for example. The wafer 11 is thicker than the wafer 31. As a result, the grooves 11d that terminate short of the face side 11a are formed in the wafer 11 from the reverse side 11b along the streets 13.

When the plasma etching is performed on the wafer 11 by the plasma processing apparatus 10, etching rate variations may occur in the wafer 11 as a result of various factors including gas flow deviations, plasma density deviations, etc. For example, etching tends to progress faster in the central portion of the wafer 11, whereas etching is liable to progress slower in the outer circumferential portion of the wafer 11. In the event of such an etching rate variation, a groove 11d (see FIG. 6B) formed in the outer circumferential portion of the wafer 11 is shallower than a groove 11d (see FIG. 6A) formed in the central portion of the wafer 11.

After the plasma etching on the wafer 11 has been completed, the mask 23 is removed from the wafer 11. In a case where the mask 23 is made of a water-soluble resin, the mask 23 can easily be removed by supplying the reverse side 11b of the wafer 11 with pure water or the like.

Next, a plurality of concentric areas are demarcated on the wafer 11 in a radial array from the center to the outer circumference of the wafer 11, and the depths of the grooves 11d are measured in the respective concentric areas (measuring step). In the measuring step, the wafer 11 with the grooves 11d formed in a grid pattern along the streets 13 is used.

Figure 7:
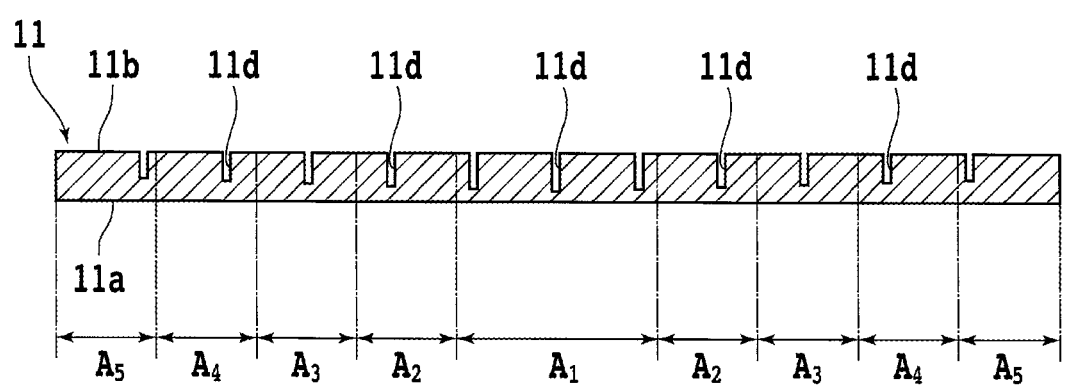
FIG. 7 is a cross-sectional view of the measurement wafer with grooves formed therein.

FIG. 7 illustrates in cross section the wafer 11 with the grooves 11d formed therein. If etching rate variations occur in the wafer 11 in the measurement etching step, then the grooves 11d formed in the wafer 11 have different depths. For example, as illustrated in FIG. 7, the grooves 11d are progressively deeper in those areas that are closer to the center of the wafer 11 and progressively shallower in those areas that are closer to the outer circumference of the wafer 11.

In the measuring step, the wafer 11 after the measurement etching step has been carried out is cut along one of the streets 13, thereby making a cross section of the wafer 11 observable as illustrated in FIG. 7. Then, a plurality of areas are demarcated on the wafer 11 in a radial array from the center to the outer circumference of the wafer 11. For example, a circular area $A_1$ including the center of the wafer 11 and a plurality of annular areas $A_2$, $A_3$, $A_4$, and $A_5$ around the area $A_1$ are demarcated on the wafer 11. The areas $A_1$, $A_2$, $A_3$, $A_4$, and $A_5$ are concentric with each other and have progressively larger diameters. The radius of the area $A_1$ and the widths of the areas $A_2$, $A_3$, $A_4$, and $A_5$ are generally the same as each other, for example. There is no limitation on the number and diameters or widths of the areas demarcated on the wafer 11. In other words, the area $A_1$ and any number of annular areas disposed around the area $A_1$ and having different diameters are demarcated on the wafer 11.

Next, the depths of the grooves 11d are measured for the respective areas $A_1$ through $A_5$. For example, an image of the cross section of the wafer 11 is captured and the depths of the grooves 11d included in the captured image are actually measured. In a case where a plurality of grooves 11d are included in one area, the depth of any one of the grooves 11d may be measured or the depths of the grooves 11d in the area may be measured and their average value may be calculated. Then, the depths of the grooves 11d for the respective areas are recorded.

The depths of the grooves 11d are commensurate with etching rates for the grooves 11d at the time the plasma processing apparatus 10 (see FIG. 4) performs plasma etching on the wafer 11. In other words, in an area where the groove 11d is deeper, the plasma etching tends to progress faster and the etching rate is higher. Therefore, the measuring step that is carried out as described above confirms a distribution of etching rate variations in the wafer 11.

Then, a product wafer is processed by plasma etching. For example, the wafer 31 (see FIG. 2B) is etched along the streets 33 and divided into a plurality of device chips including the respective devices 35. The wafer 31 is etched using the plasma processing apparatus 10 (see FIG. 4). However, if there are etching rate variations in the wafer 11 at the time plasma etching is performed on the wafer 11, the wafer 31 will be unlikely to be divided properly. For example, in a case where the etching rate on the outer circumferential portion of the wafer 31 is lower than the etching rate on the central portion of the wafer 31 (see FIGS. 6A and 6B), the outer circumferential portion of the wafer 31 will be likely to be divided imperfectly. If processing conditions are varied to make sure that the outer circumferential portion of the wafer 31 will be divided completely, then the plasma etching still continues in the central area of the wafer 31 after the division has been completed, thereby excessively processing the wafer 11 to the extent that device chips produced from the central area of the wafer 31 may possibly suffer a reduction in quality.

According to the present embodiment, the thickness of the wafer 31 is adjusted on the basis of the measured results, i.e., the measured thicknesses, from the measuring step (thickness adjusting step). Specifically, before the plasma etching is carried out, the wafer 31 is processed to adjust the thickness thereof such that the wafer 31 is thicker in areas where the etching rate is higher, i.e., areas where etching tends to progress faster, and thinner in areas where the etching rate is lower, i.e., areas where etching tends to progress slower.

In the thickness adjusting step, first, a plurality of concentric areas are demarcated on the wafer 31 in a radial array from the center to the outer circumference of the wafer 31. Specifically, as with the wafer 11 (see FIG. 7), areas $A_1$ through $A_5$ are demarcated on the wafer 31. The dimensions, i.e., the diameters and widths, of the areas $A_1$ through $A_5$ demarcated on the wafer 31 are identical to the dimensions of the areas $A_1$ through $A_5$ demarcated on the wafer 11.

Next, the thickness of the wafer 31 is adjusted such that those areas of the wafer 31 that correspond to the areas of the wafer 11 where the depths of the grooves 11d (see FIG. 7) measured in the measuring step are smaller, i.e., the grooves 11d are shallower, are thinner. Specifically, as illustrated in FIG. 7, the grooves 11d are deeper in those areas of the wafer 11 that are closer to the center of the wafer 11, and shallower in those areas of the wafer 11 that are closer to the outer circumference of the wafer 11. Accordingly, the wafer 31 is processed to become progressively thinner from the center, i.e., the area $A_1$, toward the outer circumference, i.e., the area $A_5$.

Figure 8:
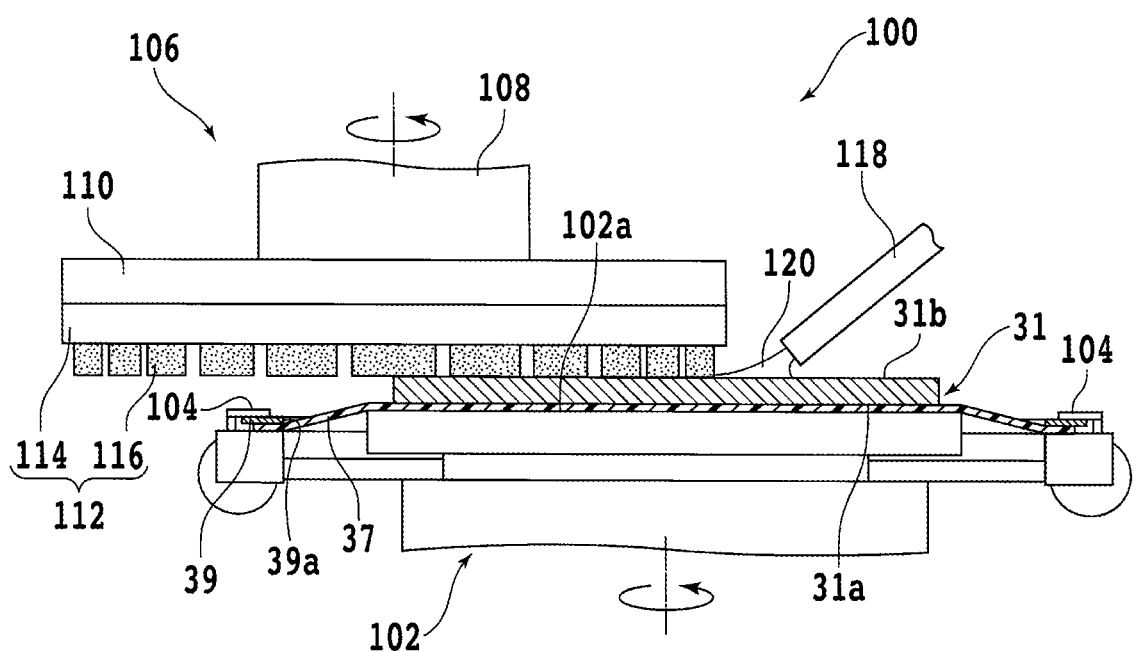
FIG. 8 is a front elevational view, partly in cross section, of a grinding apparatus.

The thickness of the wafer 31 is adjusted using a grinding apparatus, for example. FIG. 8 illustrates a grinding apparatus 100 in front elevation, partly in cross section, that can be used in the thickness adjusting step. As illustrated in FIG. 8, the grinding apparatus 100 includes a chuck table, i.e., a holding table, 102 for holding the wafer 31 thereon and a grinding unit 106 for grinding the wafer 31 held on the chuck table 102.

The chuck table 102 has an upper surface acting as a flat holding surface 102a for holding the wafer 31 thereon. The holding surface 102a is connected to a suction source, not illustrated, such as an ejector through a fluid channel 102b (see FIG. 9) defined in the chuck table 102, a valve, not illustrated, etc. To the chuck table 102, there are connected a ball-screw moving mechanism, not illustrated, for moving the chuck table 102 in horizontal directions and a rotary actuator, not illustrated, such as an electric motor for rotating the chuck table 102 about a rotational axis generally parallel to vertical directions. The grinding apparatus 100 also includes a plurality of clamps 104 disposed around the chuck table 102 for gripping and securing a frame 39 that supports the wafer 31.

The grinding unit 106 is disposed above the chuck table 102. The grinding unit 106 includes a hollow cylindrical spindle 108 extending in vertical directions. A disk-shaped wheel mount 110 is fixed to the distal end, i.e., the lower end, of the spindle 108. A rotary actuator, not illustrated, such as an electric motor for rotating the spindle 108 about its central axis is connected to the proximal end, i.e., the upper end, of the spindle 108.

A grinding wheel 112 for grinding the wafer 31 is mounted on a lower surface of the wheel mount 110. The grinding wheel 112 includes an annular base 114 made of a metal such as stainless steel or aluminum and having substantially the same diameter as the wheel mount 110. The grinding wheel 112 also includes a plurality of grindstones 116 fixed to a lower surface of the base 114. Each of the grindstones 116 is shaped as a rectangular parallelepiped. The grindstones 116 are arrayed in an annular pattern at generally equal spaced intervals along the outer circumferential edge of the base 114. The grinding wheel 112 is rotatable about a rotational axis generally parallel to vertical directions by rotational power transmitted from the rotary actuator through the spindle 108 and the wheel mount 110.

A ball-screw moving mechanism, not illustrated, is connected to the grinding unit 106 for lifting and lowering the grinding unit 106 in vertical directions. A nozzle 118 for supplying a grinding fluid 120 such as pure water to the wafer 31 held on the chuck table 102 and the grindstones 116 of the grinding wheel 112 is disposed in the vicinity of the grinding unit 106.

For grinding the wafer 31, the wafer 31 is held on the chuck table 102. Specifically, the wafer 31 is placed on the chuck table 102 such that the face side 31a, i.e., the protective member 37 side, faces the holding surface 102a and the reverse side 31b is exposed upwardly. The frame 39 is gripped and secured in position by the clamps 104. Then, the suction source applies a negative pressure to the holding surface 102a of the chuck table 102, holding the wafer 31 under suction on the holding surface 106a with the protective member 37 interposed therebetween.

Next, the chuck table 102 is moved to a position below the grinding unit 106. Then, while the chuck table 102 and the grinding wheel 112 are being rotated about their rotational axes at respective predetermined rotational speeds in respective directions, the grinding wheel 112 is lowered toward the chuck table 102. The speed at which the grinding wheel 112 is lowered is adjusted such that the grindstones 116 are pressed against the wafer 31 under appropriate forces. When the rotating grindstones 116 are brought into contact with the reverse side 31b of the wafer 31, the grindstones 116 start scraping the reverse side 31b of the wafer 31, thereby grinding and thinning the wafer 31. While the wafer 31 is thus ground, the grinding fluid 120 supplied from the nozzle 118 cools the wafer 31 and the grindstones 116 and washes away debris, i.e., swarf, produced by the grinding of the wafer 31. The wafer 31 is continuously ground until it is thinned to a predetermined thickness, i.e., a finished thickness, whereupon the wafer 31 stops being ground.

Figure 9:
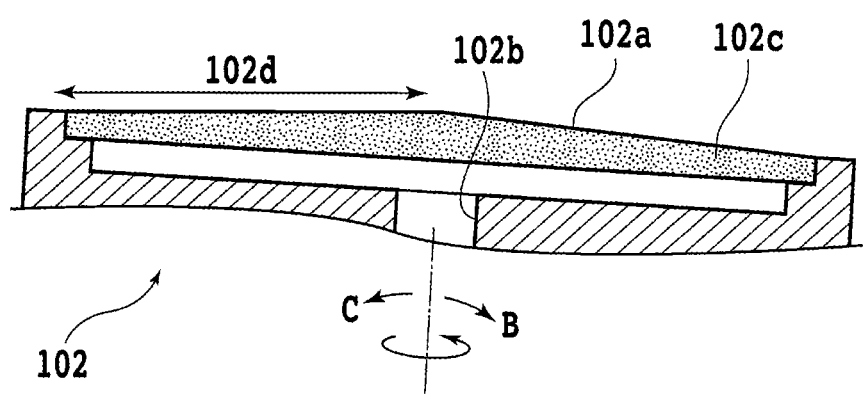
FIG. 9 is a cross-sectional view of a chuck table of the grinding apparatus.

When the wafer 31 is ground by the grinding apparatus 100, the shape of the wafer 31 that will have been ground can be controlled by adjusting the angle of the chuck table 102. FIG. 9 illustrates the chuck table 102 in cross section.

The chuck table 102 has an upwardly open circular recess defined in an upper surface thereof, and a disk-shaped holder, i.e., a suction member, 102c made of a porous material such as porous ceramic is fitted in the circular recess. The holder 102c is connected to a suction source, not illustrated, through the fluid channel 102b defined in the chuck table 102. The holder 102c has an upper surface acting as a holding surface 102a of the chuck table 102. The holder 102c has its thickness progressively larger from its outer circumferential edge toward its center. Specifically, the upper surface, i.e., the holding surface 102a, of the holder 102c is of an upwardly projected V-shaped cross section with the crest at its center. In FIG. 9, the gradient of the holding surface 102a is illustrated as exaggerated. If the holder 102c has a diameter ranging from approximately 290 to 310 mm, for example, then the difference between the vertical position of the center of the upper surface of the holder 102c, i.e., the position of the center of the upper surface thicknesswise of the holder 102c, and the vertical position of the outer circumferential edge of the upper surface of the holder 102c is set to a value in a range of approximately 10 to 20 μm.

In the grinding apparatus 100, the chuck table 102 is installed in a slightly tilted state such that an area 102d of the holding surface 102a that underlies the grindstones 116 (see FIG. 8) lies parallel to the lower surfaces of the grindstones 116 that lie in horizontal directions. The chuck table 102 is rotatable about a rotational axis generally parallel to the thicknesswise directions of the holder 102c. The position of the center of the holder 102c is aligned with the position of the rotational axis about which the chuck table 102 is rotatable. The wafer 31 is held under suction on the chuck table 102 in a slightly curved state along the holding surface 102a, and will be ground by the grindstones 116.

The chuck table 102 is arranged to make its angle of tilt variable. Specifically, the chuck table 102 can be tilted to incline its rotational axis in a first direction, i.e., the direction indicated by an arrow B, and a second direction, i.e., the direction indicated by an arrow C. The shape of the wafer 31 that will have been ground can be controlled by adjusting the tilt of the chuck table 102.

Figure 10A:
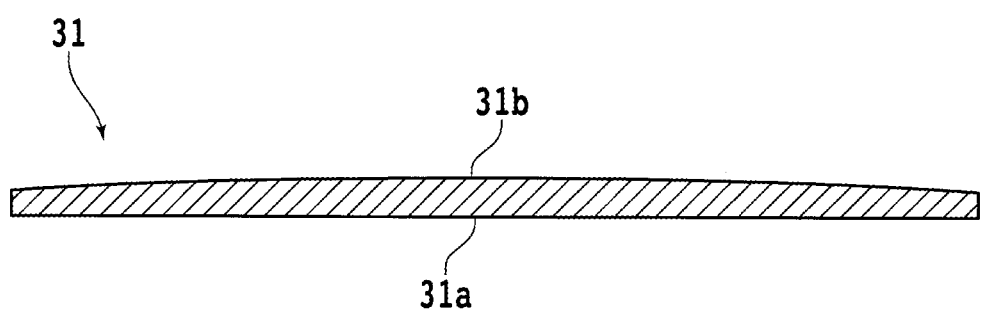
FIG. 10A is a cross-sectional view of a product wafer that has been ground on the chuck table tilted in a first direction.
Figure 10B:
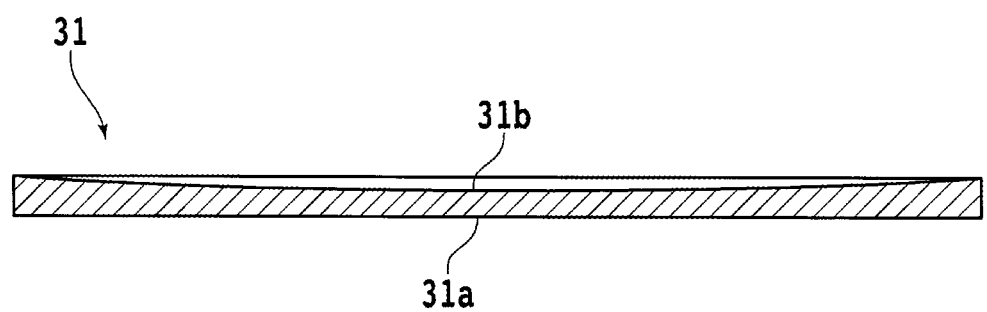
FIG. 10B is a cross-sectional view of a product wafer that has been ground on the chuck table tilted in a second direction.

FIG. 10A illustrates in cross section a wafer 31 that has been ground on the chuck table 102 tilted in the first direction, and FIG. 10B illustrates in cross section a wafer 31 that has been ground on the chuck table 102 tilted in the second direction. In a case where the chuck table 102 is tilted in the first direction (see the arrow B in FIG. 9) and the wafer 31 is ground on the chuck table 102 where the center of the holding surface 102a is slightly lower than the outer circumferential edge thereof in the area 102d, the wafer 31 has its outer circumferential portion ground preferentially. As a result, as illustrated in FIG. 10A, the ground wafer 31 is ground such that it is progressively thicker from the outer circumferential edge toward the center thereof, with the reverse side 31b being upwardly projected. On the other hand, in a case where the chuck table 102 is tilted in the second direction (see the arrow C in FIG. 9) and the wafer 31 is ground on the chuck table 102 where the center of the holding surface 102a is slightly higher than the outer circumferential edge thereof in the area 102d, the wafer 31 has its central portion ground preferentially. As a result, as illustrated in FIG. 10B, the ground wafer 31 is ground such that it is progressively thinner from the outer circumferential edge toward the center thereof, with the reverse side 31b being downwardly projected.

In the thickness adjusting step, the wafer 31 is ground such that it is thinner in those areas of the wafer 31 that correspond to the areas of the wafer 11 where the grooves 11d (see FIG. 7) are shallower, and thicker in those areas of the wafer 31 that correspond to the areas of the wafer 11 where the grooves 11d are deeper. Specifically, in the wafer 11, the etching rate is lower and the grooves 11d are shallower in those areas that are closer to the outer circumferential edge thereof. Further, the wafer 31 is made of a material identical or similar to the material of the wafer 11, and the distribution of etching rate variations of the wafer 31 exhibits the same tendency as the distribution of etching rate variations of the wafer 11. Accordingly, the chuck table 102 of the grinding apparatus 100 is tilted in the first direction (see the arrow B in FIG. 9) and the wafer 31 is ground on the chuck table 102 thus tilted. In this manner, the wafer 31 that is thicker in the areas, i.e., the central portion, where the etching rate is higher and thinner in the areas, i.e. the outer circumferential portion, where the etching rate is lower (see FIG. 10A).

There is no limitation on processes of adjusting the thickness of the wafer 31. For example, the thickness of the wafer 31 may be adjusted using a polishing apparatus in place of the grinding apparatus 100. The polishing apparatus includes a chuck table, i.e., a holding table, for holding the wafer 31 and a polishing unit with a polishing pad mounted thereon for polishing the wafer 31 held on the chuck table. The polishing pad includes, for example, a disk-shaped polishing layer made of nonwoven fabric or foamed urethane with abrasive grains, i.e., fixed abrasive grains, dispersed therein. The abrasive grains of the polishing layer may be made of silica whose particle diameters range from approximately 0.1 to 10 µm. While supplying the wafer 31 and the polishing pad with a polishing fluid, the chuck table and the polishing pad are rotated about their respective rotational axes and the polishing layer of the polishing pad is pressed against the wafer 31, thereby polishing the wafer 31. As is the case with the grinding apparatus 100, the angle of tilt of the chuck table of the polishing apparatus can be adjusted (see FIG. 9) to control the thickness of the wafer 31 (see FIGS. 10A and 10B). In the thickness adjusting step, alternatively, the thickness of the wafer 31 may be adjusted by etching the wafer 31 in its entirety using the plasma processing apparatus 10 (see FIG. 4). In this case, the wafer 31 may be processed to a desired shape by appropriately adjusting the position of the wafer 31 and etching conditions for plasma etching.

Figure 11A:
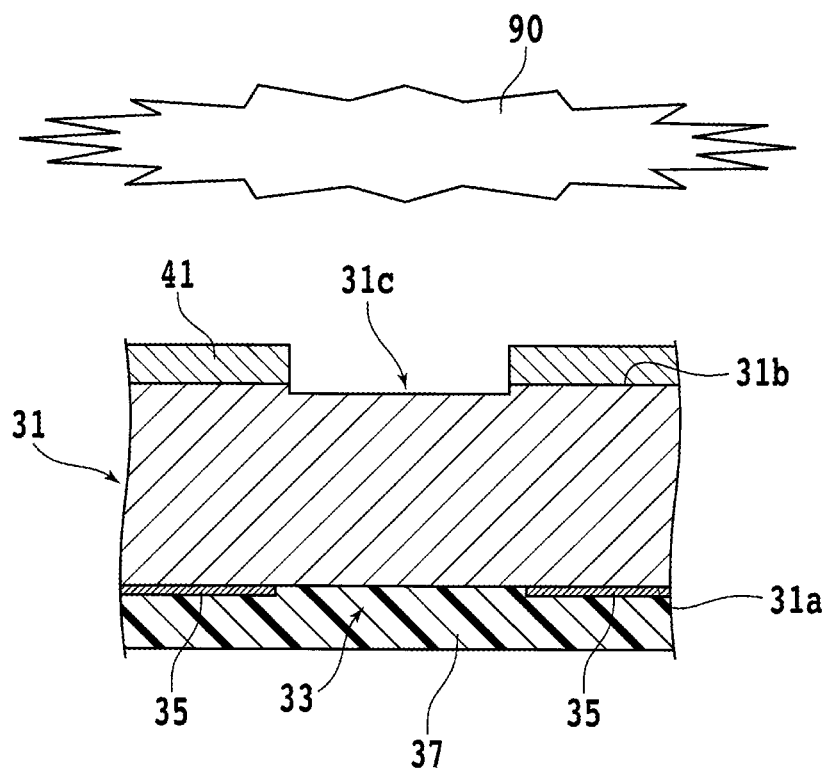
FIG. 11A is an enlarged fragmentary cross-sectional view of the product wafer in an etching step.

Next, a gas in a plasma state is supplied to the areas of the wafer 31 that correspond to the streets 33, thereby etching the wafer 31 (etching step). FIG. 11A illustrates the wafer 31 in the etching step in enlarged fragmentary cross section. A process of etching the wafer 31 by supplying a gas in a plasma state to the reverse side 31b of the wafer 31 will be described below by way of example.

In the etching step, a mask, i.e., a second mark, 41 for use in performing plasma etching is formed on the reverse side 31b of the wafer 31. The mask 41 is formed to expose those areas of the reverse side 31b of the wafer 31 that correspond to the streets 33, i.e., the areas overlapping the streets 33, and to cover those areas of the reverse side 31b of the wafer 31 that correspond to the devices 35, i.e., the areas overlapping the devices 35. The mask 41 is made of the same material and formed by the same process as with the mask 23 (see FIG. 3B).

Next, a gas in a plasma state is supplied to those areas of the reverse side 31b of the wafer 31 that are exposed and correspond to the streets 33, thereby etching the areas under predetermined conditions. The wafer 31 may be etched using the plasma processing apparatus 10 (see FIG. 4). The procedure for performing plasma etching on the wafer 31 with the plasma processing apparatus 10 is the same as the measurement etching step (see FIG. 5). The gas 90 in the plasma state is supplied to those areas, i.e., second areas, 31c of the reverse side 31b of the wafer 31 that are not covered with the mask 41. The areas 31c are exposed through the mask 41 and correspond to the areas corresponding to the streets 13, i.e., the areas overlapping the streets 33.

Figure 11B:
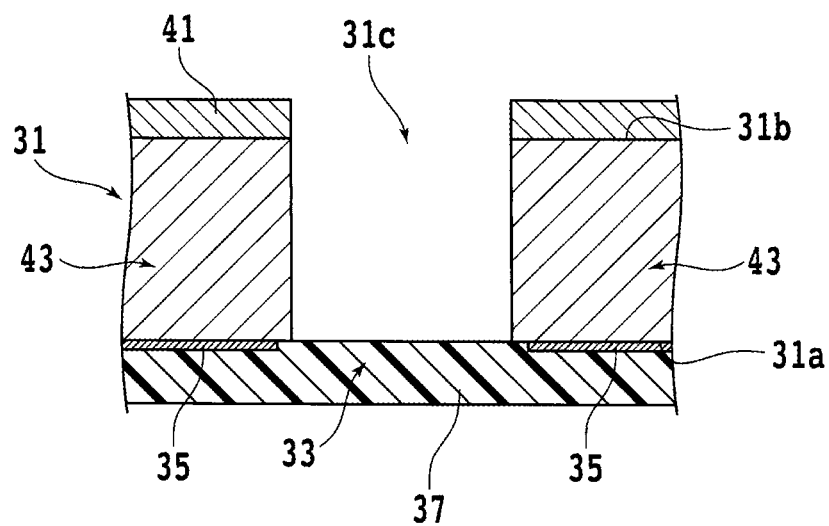
FIG. 11B is an enlarged fragmentary cross-sectional view of the product wafer after plasma etching.

In the etching step, the gas 90 is supplied to the wafer 31 while the protective member 37 is disposed on the surface, i.e., the face side 31a, of the wafer 31 that is opposite the surface thereof, i.e., the reverse side 31b, to which the gas 90 is supplied. The areas 31c of the wafer 31 are etched, forming grooves in the wafer 31 from the reverse side 31b toward the face side 31a. When the plasma etching is continued until the grooves from the reverse side 31b reach the face side 31a, the areas 31c of the wafer 31 are removed. FIG. 11B illustrates the wafer 31 after the plasma etching in enlarged fragmentary cross section. The wafer 31 is thus divided along the streets 33, producing a plurality of device chips 43 including the respective devices 35.

When the above etching step is carried out, the wafer 31 is thicker in the areas, i.e., the central portion, where the etching rate is higher and thinner in the areas, i.e. the outer circumferential portion, where the etching rate is lower (see FIG. 10A). Consequently, the difference between the times when the grooves reach the face side 31a of the wafer 31 in the central and outer circumferential portions of the wafer 31 is reduced. The central portion of the wafer 31 is thus prevented from being excessively etched, and the wafer 31 is appropriately divided in its entirety.

In the method of processing a wafer according to the present embodiment, as described above, the thickness of the wafer 31 is adjusted depending on the depths of the grooves 11d formed in the wafer 11 by plasma etching, and thereafter plasma etching is performed on the wafer 31. The etching rate variations in the wafer 31 are thus reflected in the thickness distribution of the wafer 31, thereby synchronizing the times when the division of the wafer 31 in the areas thereon is completed. In this manner, the wafer 31 is less liable to have areas where it is etched imperfectly and areas where it is etched excessively, and hence can be divided properly.

In the above embodiment, when plasma etching is performed on the wafer 11, the mask 23 is formed on the reverse side 11b of the wafer 11 (see FIG. 3B). However, the mask 23 may be formed on the face side 11a of the wafer 11. In this case, the protective member 17 is disposed on the reverse side 11b of the wafer 11, and the gas 90 in the plasma state is supplied through the mask 23 to the face side 11a of the wafer 11. Similarly, when plasma etching is performed on the wafer 31, the mask 41 (see FIG. 11A) may be formed on the face side 11a of the wafer 11. In this case, the protective member 37 is disposed on the reverse side 31b of the wafer 31, and the gas 90 in the plasma state is supplied through the mask 41 to the face side 31a of the wafer 31.

Other changes and modifications may be made in the structural details, the method details, etc. according to the above embodiment without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer, comprising:
    a wafer preparing step of preparing a measurement wafer and a product wafer each including a first surface that has a plurality of areas demarcated by a plurality of streets thereon and a second surface that is opposite the first surface;
    a measurement etching step of forming a first mask on the first surface or the second surface of the measurement wafer and supplying a gas in a plasma state to first areas of the measurement wafer that are exposed through the first mask and that correspond to the streets to etch the first areas under predetermined conditions to form grooves in the measurement wafer;
    after the measurement etching step, a measuring step of demarcating a plurality of concentric areas in an array from a center to an outer circumference of the measurement wafer and measuring depths of the grooves in the respective concentric areas;
    after the measuring step, a thickness adjusting step of adjusting a thickness of the product wafer such that the product wafer is progressively thinner in areas thereof that correspond to the areas of the measurement wafer where the grooves are shallower; and,
    after the thickness adjusting step, an etching step of forming a second mask on the first surface or the second surface of the product wafer and supplying a gas in a plasma state to second areas of the product wafer that are exposed through the second mask and that correspond to the streets to etch the second areas under predetermined conditions.

2. The method of processing a wafer according to claim 1, wherein
    the thickness adjusting step includes performing grinding, polishing, or plasma etching on the product wafer to adjust the thickness of the product wafer.

3. The method of processing a wafer according to claim 1, wherein
    the measurement etching step includes supplying the gas in the plasma state to the measurement wafer while a first protective member for protecting the measurement wafer is disposed on a surface of the measurement wafer that is opposite to the surface thereof to which the gas in the plasma state is supplied, and
    the etching step includes supplying the gas in the plasma state to the product wafer while a second protective member for protecting the product wafer is disposed on a surface of the product wafer that is opposite to the surface thereof to which the gas in the plasma state is supplied.

* * * * *